United States Patent
Ramaswamy et al.

(10) Patent No.: US 7,389,463 B2
(45) Date of Patent: Jun. 17, 2008

(54) HIERARCHICAL BLOCK CODING FOR A PACKET-BASED COMMUNICATIONS SYSTEM

(75) Inventors: Kumar Ramaswamy, Plainsboro, NJ (US); Louis Robert Litwin, Jr., Plainsboro, NJ (US)

(73) Assignee: Thomson Licensing, Boulogne Billancourt (FR)

(*) Notice: Subject to any disclaimer, the term of this patent is extended or adjusted under 35 U.S.C. 154(b) by 471 days.

(21) Appl. No.: 10/107,025

(22) Filed: Mar. 26, 2002

(65) Prior Publication Data

US 2002/0184590 A1 Dec. 5, 2002

(51) Int. Cl.
*H03M 13/00* (2006.01)
(52) U.S. Cl. .................... 714/752; 714/701; 714/784
(58) Field of Classification Search ............ 714/752, 714/784, 701, 751, 774, 786; 712/28; 360/48
See application file for complete search history.

(56) References Cited

U.S. PATENT DOCUMENTS

| | | | |
|---|---|---|---|
| 4,364,081 A | 12/1982 | Hashimoto et al. | |
| 4,417,339 A | 11/1983 | Cantarella | |
| 4,447,902 A * | 5/1984 | Wilkinson | 714/755 |
| 4,716,567 A * | 12/1987 | Ito et al. | 714/753 |
| 4,760,576 A | 7/1988 | Sako | |
| 4,796,261 A | 1/1989 | Moriwaki | |
| 5,159,452 A * | 10/1992 | Kinoshita et al. | 348/466 |
| 5,392,299 A | 2/1995 | Rhines et al. | |
| 5,412,667 A | 5/1995 | Havemose | |
| 5,450,421 A | 9/1995 | Joo et al. | |
| 5,559,506 A | 9/1996 | Leitch | |
| 5,642,365 A * | 6/1997 | Murakami et al. | 714/761 |
| 5,677,918 A * | 10/1997 | Tran et al. | 714/748 |
| 5,699,062 A | 12/1997 | Widmer | |
| 5,844,918 A * | 12/1998 | Kato | 714/751 |

(Continued)

FOREIGN PATENT DOCUMENTS

EP 0 306 196 * 3/1989

(Continued)

OTHER PUBLICATIONS

Oguz, N. C. et al.: "Performance Analysis of Two-Level Forward Error Correction for Lost Cell Recovery in ATM Networks", Proceedings of Infocom '95—Conference on Computer Communications. Fourteenth Annual Joint Conference of the IEEE Computer and Communications Societies, Boston, Apr. 2-6, 1995, Los Alamitos, IEEE Comp. Soc. Press, U.S., vol. 2, Conf. 14, Apr. 2, 1995, pp. 728-737, XP000580642.

(Continued)

*Primary Examiner*—Guy J Lamarre
(74) *Attorney, Agent, or Firm*—Joseph J. Laks; Paul P. Kiel

(57) ABSTRACT

A method for hierarchically block coding a packet stream includes the steps of appending a packet error correction code to each packet in the packet stream and appending a block error correction code to successive blocks of packets in the packet stream to form a hierarchically error correction coded packet stream. This packet stream is then transmitted through a communications channel. Errors are corrected in each block of packets in response to each block error correction code and errors are corrected in each packet in each block in response to each packet error correction code.

34 Claims, 1 Drawing Sheet

U.S. PATENT DOCUMENTS

| | | | |
|---|---|---|---|
| 6,006,318 A * | 12/1999 | Hansen et al. | 712/28 |
| 6,029,266 A | 2/2000 | Lee | |
| 6,065,147 A | 5/2000 | Pyndiah et al. | |
| 6,122,763 A | 9/2000 | Pyndiah et al. | |
| 6,161,209 A | 12/2000 | Moher | |
| 6,317,418 B1 * | 11/2001 | Raitola et al. | 370/278 |
| 6,397,366 B1 | 5/2002 | Tanaka et al. | |
| 6,434,719 B1 | 8/2002 | Livingston | |
| 6,453,439 B1 | 9/2002 | Hattori et al. | |
| 6,460,162 B1 | 10/2002 | Buda et al. | |
| 6,499,128 B1 | 12/2002 | Gerlach et al. | |
| 6,526,538 B1 | 2/2003 | Hewitt | |
| 6,542,479 B1 * | 4/2003 | Boudier et al. | 370/319 |
| 6,574,775 B1 | 6/2003 | Chouly | |
| 6,577,813 B1 | 6/2003 | Ibaraki et al. | |
| 6,581,178 B1 | 6/2003 | Kondo | |
| 6,697,984 B1 * | 2/2004 | Sim et al. | 714/751 |
| 6,711,704 B1 * | 3/2004 | Tezuka | 714/712 |
| 6,785,733 B1 | 8/2004 | Mimura et al. | |
| 6,799,287 B1 | 9/2004 | Sharma et al. | |
| 6,904,095 B1 | 6/2005 | Wilkinson et al. | |
| 2002/0129313 A1 * | 9/2002 | Kubo et al. | 714/752 |

FOREIGN PATENT DOCUMENTS

| | | |
|---|---|---|
| EP | 0 663 776 | 7/1995 |
| EP | 0 928 116 | 7/1999 |
| JP | 11088856 | 3/1999 |
| JP | 2000174819 | 6/2000 |
| JP | 2000187940 | 7/2000 |
| JP | 2000 349792 | 12/2000 |

OTHER PUBLICATIONS

Patent Abstracts of Japan, vol. 2000, No. 15, Apr. 6, 2001. (corresponds to 3rd reference listed in Foreign Documents Section on p. 1).

* cited by examiner

HIERARCHICAL BLOCK CODING FOR A PACKET-BASED COMMUNICATIONS SYSTEM

FIELD OF THE INVENTION

The present invention relates to packet-based communications system including error correction coding to improve reliability.

BACKGROUND OF THE INVENTION

Packet-based communications systems have been developed for transmitting digital signals. In some communications systems, the communications channel is noisy and can introduce errors into the packets, decreasing the reliability of the communications. In others, such as the internet, the communications channel can lose packets altogether. Systems have been developed to increase the reliability of such communications systems.

These systems include some kind of error detection and correction mechanism. For example, in U.S. Pat. No. 5,677,918, entitled "METHOD AND DEVICE FOR EFFICIENT ERROR CORRECTION IN A PACKET-SWITCHED COMMUNICATION SYSTEM" and issued Oct. 14, 1997 to Tran et al., a packet switched communication system is disclosed in which packets of data are divided into segments. A first error detection code is generated over each segment, and a second over the packet as a whole. The segments making up the packet are then transmitted over the communications channel. A receiver receives the segments and checks the error detection codes in each segment and the packet. If an error is detected in a segment or the packet as a whole, the receiver sends a negative acknowledgement to the transmitter, which, in response, retransmits the erroneous segment, or the entire packet, until it has been successfully received.

This system depends on negative acknowledgements and retransmission to correct erroneous packets. This requires additional communications, reducing the overall throughput, and requires a back channel from the receiver to the transmitter to communicate the negative acknowledgements. Such a back channel is not always available. For example, broadcast systems such as terrestrial, cable and satellite television transmission system are one-way systems only.

In European patent publication EP 1 014 730 A1, entitled "FORWARD ERROR CORRECTION AT MPEG-2 TRANSPORT STREAM LAYER" and published Dec. 22, 1999 for Wan et al., an MPEG packet system is disclosed in which a plurality of packets, termed a supergroup, is accumulated, and an error correction code is generated over the data in the supergroup. The error correction code data is then packetized and appended to the packet stream as optional packets. Appropriately equipped receivers may receive the MPEG packets and the optional appended error correction code packets and perform error correction on the received supergroup of MPEG packets.

U.S. Pat. No. 5,122,875, entitled "AN HDTV COMPRESSION SYSTEM" issued Jun. 16, 1992 to Raychaudhuri et al., discloses a packet communications system in which high priority and low priority MPEG data are transmitted in respective packet streams on separate modulated carriers. Each packet in both packet streams includes an error detection code. In addition respective forward error correction codes are calculated over successive blocks of packets in both packet streams then appended to the packet streams. At the receiver, the forward error correction code is used to correct for errors in the respective received packet streams. Then the error detection code in each packet in both packet streams is analyzed to determine if an error remains in that packet. If such as error is detected, then some form of error concealment is performed. For example, for video MPEG data, should an erroneous packet be detected, the image area represented by that packet is not updated to prevent the erroneous data from distorting the image.

It is known that every error correction code can correct a maximum number of errors. The number of errors correctable by the code is related to the number of code bits relative to the number of data bits protected, i.e. to correct more errors requires more code bits, which, in turn, increases the overhead and lowers the throughput of the communications system. While it is possible to select an error correction code which is strong enough to correct for the loss of one or more packets (e.g. in EP 1 014 730 A1 up to nine lost packets and up to 4½ 'errored' packets may be corrected), there is always a limit to the number of lost packets which may be corrected. If any more than that number is lost, then all of the packets in the block of packets over which the error correction code was originally calculated are compromised. In such a case, in order to minimize potential image degradation, none of the packets in the group are used in generating an image. However, it is desirable that, even if more than the predetermined number of packets is lost, the data in the remaining packets be made available for use.

BRIEF SUMMARY OF THE INVENTION

In accordance with principles of the present invention, a packet stream is hierarchically block encoded by appending a packet error correction code to each packet in the packet stream and appending a block error correction code to successive blocks of packets in the packet stream to form a hierarchically error correction coded packet stream. This packet stream is then transmitted through a communications channel. Errors are corrected in each block of packets in response to each block error correction code and errors are corrected in each packet in response to each packet error correction code.

In this manner, error correction encoding of a packetized data stream is partitioned into ECC encoding each individual packet and ECC encoding blocks of packets. The inventor has realized that by including separate error correction coding for each block of packets and for each packet by itself, it is possible to provide some level of error detection and correction even with the loss of more than the predetermined number of packets. That is, if more than the predetermined number of packets are lost or corrupted, then the block error correction code will be unable to provide any correction. However, it is still possible that some of the packets will have few enough errors that the associated packet error correction code can correct them. This will enable at least some of the packets in the block of packets to provide reliable information despite the loss of the block error correction. Furthermore, because of the packet ECC encoding, it may be possible to reduce the strength, and thus, the length of the block ECC code.

The inventor has also realized that by including separate error correction coding for each block of packets and for each packet by itself, a stronger code may be produced than by providing ECC coding for each packet without the coding of blocks of packets. If errors are spread out throughout the group of packets, the packet ECC codes in each packet can handle the relatively few errors in that packet. However, if errors occur in a burst, then most packets will be error-free, while one packet will have more errors than the packet ECC code can correct. In such a case, the block ECC code can correct the burst of errors in the single erroneous packet, and all packets may be utilized.

BRIEF DESCRIPTION OF THE DRAWING

In the drawing:

FIG. 1a is a block diagram of a portion of a communications system incorporating principles of the present invention; and FIG. 1b is a packet diagram illustrating the contents of a packet stream communicated by the communications system of FIG. 1a.

DETAILED DESCRIPTION OF THE INVENTION

Figure 1:
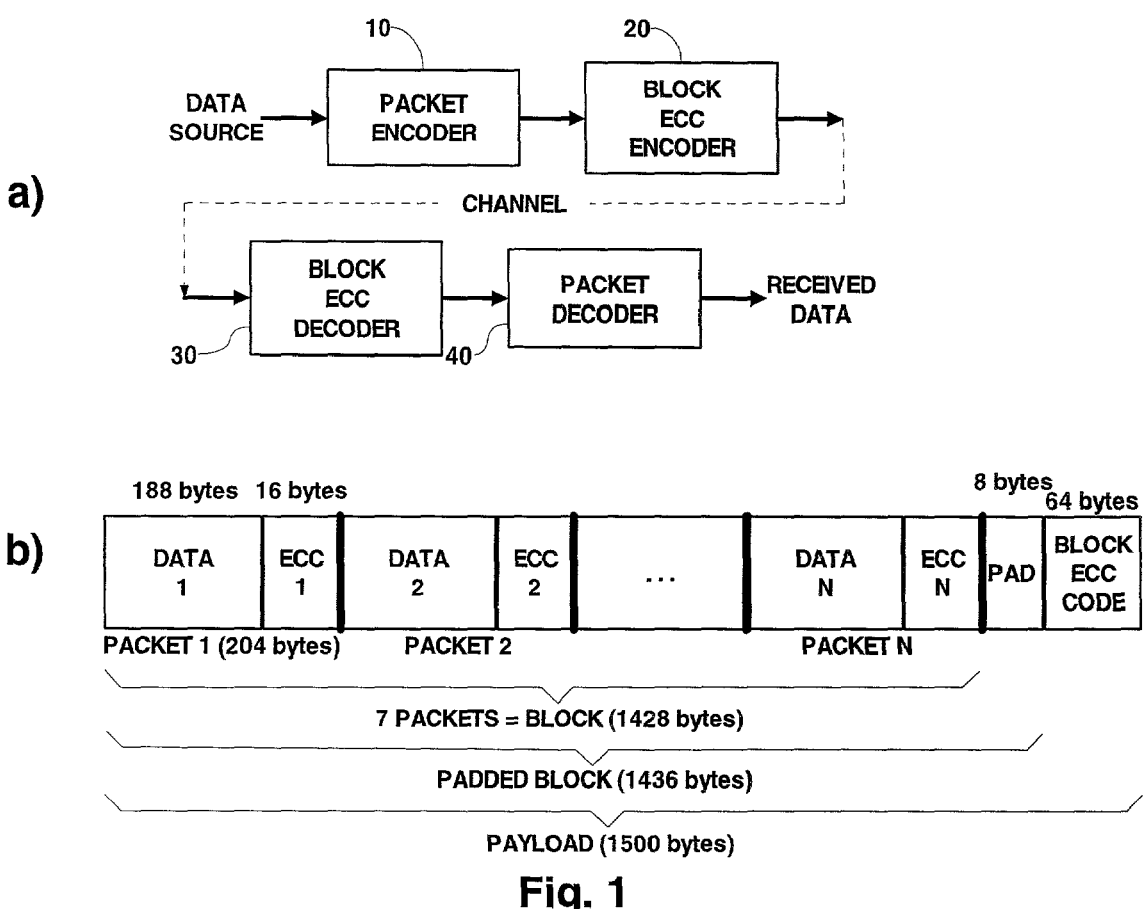

FIG. 1a is a block diagram of a portion of a communications system incorporating principles of the present invention. In FIG. 1a, only those elements which are necessary to implement and understand the operation of the present invention are illustrated. One skilled in the art will understand: that such a system includes many other elements, what those elements are, and how to design, implement and interconnect those elements to form a working system.

In FIG. 1a, a source (not shown) of digital data is coupled to an input terminal of a packet encoder 10. The data source may be any source of digital data. For example, for a digital television broadcast system, the data source may be an MPEG encoder encoding video, audio and auxiliary information representing one or more television programs into a digital data stream in a known manner. An output terminal of the packet encoder 10 is coupled to an input terminal of a block error correction code (ECC) encoder 20. The combination of the packet encoder 10 and the block ECC encoder 20 is comprised in a transmitter.

An output terminal of the block ECC encoder 20 is coupled to an input terminal of a block ECC decoder 30 via a communications channel, illustrated as a dashed line in FIG. 1a. An output terminal of the block ECC decoder 30 is coupled to an input terminal of a packet decoder 40. An output terminal of the packet decoder 40 is coupled to a utilization means for the received data. For example, in a digital television receiver, the utilization means may include an MPEG decoder, and other known television circuitry to produce an image representing the received video data and sound representing the received audio data. The combination of the block ECC decoder 30 and the packet decoder 40 is comprised in a receiver.

FIG. 1b is a packet diagram useful in understanding the operation of the system illustrated in FIG. 1a. In operation, groups of data bytes from the data source are processed to generate associated packet error correction code (ECC) bytes. The packet ECC bytes are then appended to the associated group of data bytes to form an ECC encoded data packet at the output terminal of the packet encoder 10. More specifically, each packet may be formed to include a fixed number of bytes including a field of data bytes and a field of the packet ECC bytes associated with that field of data bytes. The stream of packets generated by the packet encoder 10 is further processed by the block ECC encoder 20. The bytes in successive blocks of packets are processed to generate an associated block ECC code. The block ECC code is appended to the block of packets over which it was calculated. For example, the block may include a fixed number of packets and the block ECC code is associated with that group of packets.

The specific embodiment illustrated in FIG. 1b relates to carrying an MPEG2 video stream over an Ethernet network connection. More specifically, a transport frame according to the MPEG2 standard includes 188 bytes, and an Ethernet payload according to the Ethernet standard includes 1500 bytes. In the illustrated embodiment, the packet ECC code used in the packet encoder 10 to encode the MPEG2 packets is a (255,239) Reed-Solomon code shortened in a known manner to a (204,188) code. Each resulting error corrected packet (PACKET 1 . . . PACKET N), therefore, includes the 188 MPEG2 transport frame data bytes (DATA 1, DATA 2 . . . DATA N) and 16 packet ECC bytes (ECC 1, ECC 2 . . . ECC N) for a total of 204 bytes, as illustrated in FIG. 1b. A block of seven 204 byte packets, totaling 1428 bytes may be included within the 1500 byte Ethernet payload. The block ECC code used in the block ECC encoder 20 to encode the ECC encoded packets is a Reed-Solomon (2047, 1983) code shortened in a known manner to a (1500,1436) code. Eight zero-valued bytes are appended to the 1428 bytes from the seven 204 byte packets to make up the 1436 data bytes required by the block ECC code. This code produces 64 ECC bytes (BLOCK ECC CODE) which are appended to the group of seven packets, as illustrated in FIG. 1b.

Although a specific application is illustrated in FIG. 1b, One skilled in the art will understand that any forward error correction (FEC) block code may be used in a system according to the present invention, and that the specific error correction code selected, the number of data bytes and the number of ECC bytes making up each data packet is arbitrary and that the illustrated embodiment is exemplary only. One skilled in the art will also understand that any FEC block code may be used, and that the specific error correction code selected, the number of packets in the block, and the number of bytes in the block ECC is arbitrary and the illustrated embodiment is exemplary only. One skilled in the art will further understand that error detecting codes, such as parity or CRC or any other error detecting codes, may also be appended to each packet or each group of packets.

When this packet stream is transmitted through the channel, it is possible for the data in the packet stream to become corrupted and/or for complete packets to be lost. The block ECC decoder 30 first analyzes the combination of the seven packets and the block ECC code to detect and correct errors in that block (if possible) in a known manner. A stream of error corrected packets, each including data and packet ECC bytes, is produced at the output terminal of the block ECC decoder 30. The packet decoder 40 then analyzes the data and packet ECC bytes in each packet to detect and correct errors in that packet (if possible) in a known manner. A stream of error corrected data extracted from those packets is produced at the output terminal of the packet decoder 40.

In the illustrated embodiment, the 16 byte packet ECC code can correct up to eight byte errors anywhere in the packet (which consists of the 188 bytes in the data field and the packet ECC field). The 64 byte block ECC code can correct up to 32 bytes of errors anywhere in the block (which consists of the 1428 bytes in the seven packets, the eight padding bytes and the 64 bytes of block ECC code). As described above, in a packet data communications system, packets can sometimes disappear between the transmitter and the receiver due to, for example, interference, buffer overflow at a repeater, etc. Loss of a packet, however causes 204 byte errors which is uncorrectable by the block ECC code. However, if the remaining six packets are received, the respective packet ECC codes in each of the packets may be used to correct up to eight byte errors in each of the received packets. These packets, therefore, may be used by the system, even though the block ECC code was ineffective to correct any errors.

Even in the event that all packets are received, the use of hierarchical ECC codes provides additional error correction. The block ECC is used to error correct the block of packets, and each packet is further error corrected by its packet ECC code. One skilled in the art will also note that the illustrated embodiment may be incorporated into the existing standard system (described above) because the block ECC coding remains the same. Only the internal arrangement of each packet is changed.

Although described in the environment of an MPEG digital television broadcast system, one skilled in the art will understand that the present invention may be used in any packet data system, such as a computer interconnection network such as the internet, or a packet switched communications system such as used in digital cellular telephones. Such a system is especially advantageous in packet communications system which use relatively small packets. One skilled in the art will further understand that further error detection and/or correction coding may be concatenated with the error coding of the present invention. For example, any of the known error detection codes, such as parity or CRC may also be appended to each packet to provide an indication of whether the packet is error-free or erroneous.

What is claimed is:

1. In a packet-based communications system, a hierarchical block coding system, comprising:
   a source of digital data;
   a packet encoder, coupled to the data source, for forming successive packets each including data and a packet error correction code;
   a block encoder, coupled to the packet encoder, for successively appending a block error correction code to a block of a plurality of packets;
   a block decoder, coupled to the block encoder, for correcting errors in each block of packets in response to each block error correction code; and
   a packet decoder, coupled to the block decoder, for correcting errors in each packet in response to each packet error correction code.

2. The system of claim 1 further comprising a communications channel, coupled between the block encoder and the block decoder, for transmitting successive blocks of packets and the appended block error correction code.

3. The system of claim 2 wherein the communications channel may introduce errors into the transmitted blocks of packets and the appended block error correction code or lose packets.

4. The system of claim 1 wherein each block includes a faxed number of packets.

5. The system of claim 4 wherein the fixed number is seven.

6. The system of claim 1 wherein each packet has a fixed length partitioned into a data field arid a packet error correction code field.

7. The system of claim 6 wherein each block Includes a fixed number of packets.

8. The system of claim 6 wherein the fixed length is 204 bytes, the data field is 158 bytes and the packet error correction code field is 16 bytes.

9. The system of claim 8 wherein the packet error correction code is a Reed-Solomon (204,188) code.

10. The system of claim 8 wherein each block includes seven packets.

11. The system of claim 10 wherein the packet error correction code is a Reed-Solomon (204,188) code and the block error correction code is a Reed-Solomon (1500,1436) code.

12. In a packet-based communications transmitter, a hierarchical block coding system, comprising:
    a source of digital data;
    a packet encoder, coupled to the data source, for forming successive packets each including data and a packet error correction code; and
    a block encoder, coupled to the packet encoder, for successively appending a block error correction code to each block of a plurality of packets.

13. The transmitter of claim 12 wherein the block encoder is coupled to a communications channel.

14. The system of claim 12 wherein each block includes a fixed number of packets.

15. The system of claim 14 wherein the fixed number is seven.

16. The system of claim 12 wherein each packet has a fixed length partitioned into a data field and a packet error correction code field.

17. The system of claim 16 wherein each block Includes a fixed number of packets.

18. The system of claim 16 wherein the fixed length is 204 bytes, the data field is 188 bytes and the packet error correction code field is 16 bytes.

19. The system of claim 18 wherein the packet error correction code is a Reed-Solomon (204,188) code.

20. The system of claim 18 wherein each block includes seven packets.

21. The system of claim 20 wherein the packet error correction code is a Reed-Solomon (204,188) code and the block error correction code is a Reed-Solomon (1500,1436) code.

22. In a packet-based communications receiver, a hierarchical block decoding system, comprising:
    an input terminal for receiving successive blocks of packets each with an appended block error correction code, and each packet including a data field and a packet error correction code field;
    a block decoder, coupled to the input terminal, for correcting errors in each block of packets in response to each block error correction code; and
    a packet decoder, coupled to the block decoder, for correcting errors in each packet In response to each packet error correction code.

23. The receiver of claim 22 wherein the input terminal is coupled to a communications channel.

24. The system of claim 22 wherein each block includes a fixed number of packets.

25. The system of claim 24 wherein the fixed number is seven.

26. The system of claim 22 wherein each packet has a fixed length partitioned into a data field and a packet error correction code field.

27. The system of claim 26 wherein each block includes a fixed number of packets.

28. The system of claim 26 wherein the fixed length is 204 bytes, the data field is 188 bytes and the packet error correction code field is 16 bytes.

29. The system of claim 28 wherein the packet error correction code is a Reed-Solomon (204,188) code.

30. The system of claim 28 wherein each block includes seven packets.

31. The system of claim 30 wherein the packet error correction code is a Reed-Solomon (204,158) code and the block error correction code is a Reed-Solomon (1500,1436) code.

32. A method for hierarchically block coding a packet stream, comprising the steps of:
- appending a packet error correction code to each packet in the packet stream;
- appending a block error correction code to successive blocks of packets in the packet stream;
- correcting errors in each block of packets in response to each block error correction code;
- thereafter correcting errors in each packet in each block in response to each packet error correction code.

33. A method for transmitting a hierarchical block coded packet stream, comprising the steps of:
- appending a packet error correction code to each packet in the packet stream;
- appending a block error correction code to each successive block of packets in the packet stream;
- transmitting said blocks of packets with said respective packet and block error correction codes.

34. A method of receiving a hierarchical block coded packet stream, comprising the steps of:
- receiving a stream of error corrected blocks of packets, each block having a block error correction code associated with each said block, and each packet having a packet error correction code associated with each said packet;
- correcting errors in each block of packets in response to the block error Correction code; and
- thereafter correcting errors in each packet in each block in response to the packet error correction code.

* * * * *